United States Patent [19]
Goodnow et al.

[11] Patent Number: 6,081,135
[45] Date of Patent: Jun. 27, 2000

[54] DEVICE AND METHOD TO REDUCE POWER CONSUMPTION IN INTEGRATED SEMICONDUCTOR DEVICES

[75] Inventors: Kenneth J. Goodnow, Essex Junction, Vt.; Michel S. Michail, Poughkeepsie, N.Y.; Clarence R. Ogilvie, Huntington, Vt.; Wilbur D. Pricer, Charlotte, Vt.; Sebastian T. Ventrone, South Burlington, Vt.

[73] Assignee: International Business Machines Corporation, Armonk, N.Y.

[21] Appl. No.: 09/074,442

[22] Filed: May 7, 1998

[51] Int. Cl.[7] .......................... H03K 19/00; H03K 3/033
[52] U.S. Cl. ............................ 326/93; 326/93; 326/95; 326/98; 326/94; 326/30; 326/119; 326/121; 327/227; 327/407; 327/408
[58] Field of Search .................. 326/93, 95, 98, 326/94, 21, 30, 119, 121; 327/227, 407, 408

[56] References Cited

U.S. PATENT DOCUMENTS

| | | | |
|---|---|---|---|
| 5,384,493 | 1/1995 | Furuki | 327/203 |
| 5,440,243 | 8/1995 | Lyon | 326/33 |
| 5,557,620 | 9/1996 | Miller, Jr. et al. | 371/22.5 |
| 5,841,300 | 11/1998 | Murabayashi et al. | 326/98 |

*Primary Examiner*—Michael Tokar
*Assistant Examiner*—Vibol Tan
*Attorney, Agent, or Firm*—Schmeiser, Olsen & Watts; Eugene I. Shkurko

[57] ABSTRACT

According to the preferred embodiment, a device and method for reducing power consumption by reducing unneeded node toggling is provided. The preferred embodiment reduces unneeded node toggling in a circuit by utilizing either a pull-up or pull-down transistor to pull the input of the circuit to a state that minimizes power consumption during periods in which the circuit is inactive. By tying the circuit input high or low during inactivity, node toggling is reduced or eliminated in that circuit. In the preferred embodiment, the inputs to the circuit all pulled after a time of inactivity which is proportional to the leakage current of the leakiest transistor in the circuit. By timing the input pulling proportional to the leakage current, the power consumption is minimized without excessive power loss caused by the pulling itself.

47 Claims, 7 Drawing Sheets

DEVICE AND METHOD TO REDUCE POWER CONSUMPTION IN INTEGRATED SEMICONDUCTOR DEVICES

BACKGROUND OF THE INVENTION

1. Technical Field

This invention generally relates to semiconductor devices, and more specifically relates to power conservation in semiconductor devices.

2. Background Art

The proliferation of electronics in our modern world is in large part due to integrated circuit semiconductor devices. Integrated semiconductor devices are designed and used in almost every electronic device today. In many applications power consumption is a critical issue for several reasons. For example, in portable devices such as wireless telephones, battery life and battery size is a primary design concern. Consumers want the portable electronic device to run as long as possible using a single battery charge and also want the device, including the battery to be as small and portable as possible. Thus, it is strongly desirable to be able to decrease power consumption of the device such that battery life can be extended and/or the size of the battery decreased.

In other applications power consumption is critical because it is directly related to the amount of heat generated by a device. A semiconductor device that consumes more power will generate more heat. In applications where heat sensitivity is a critical factor, reducing the power consumption reduces the heat generated by the device.

One factor that leads to excessive power consumption is unnecessary node toggling. In almost any digital network during a typical clock cycle, certain internal nodes will toggle unnecessarily. These nodes are typically responding to some logical input, but their logical output is unused and unneeded. The toggling of nodes uses power, but produces no useful work.

For example, normal design techniques use common data sources, such as a single set of input lines, for the data and control bits used during different combinatorial calculations. Not all calculations are required for each cycle of operation. As a particular example, in a processor that has both an adder and multiplier, the adder may be required during a certain cycle but not the multiplier. If a single data register is used as a data source for both the adder and the multiplier, both the adder and multiplier circuits will toggle even though only one is needed. This unnecessary toggling of nodes again uses power, but produces no useful work.

Therefore, there existed a need to provide reduced power consumption by reducing unnecessary node toggling in semiconductor devices.

DISCLOSURE OF INVENTION

According to the present invention, a device and method for reducing power consumption by reducing unneeded node toggling is provided. The preferred embodiment reduces unneeded node toggling in a circuit by utilizing either a pull-up or pull-down transistor to pull the input of the circuit to a state that minimizes power consumption during periods in which the circuit is inactive. By tying the circuit input high or low during inactivity, node toggling is reduced or eliminated in that circuit. In the preferred embodiment, the inputs to the circuit all pulled after a time of inactivity which is proportional to the leakage current of the leakiest transistor in the circuit. By timing the input pulling proportional to the leakage current, the power consumption is minimized without excessive power loss caused by the pulling itself.

The foregoing and other features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and.

BEST MODE FOR CARRYING OUT THE INVENTION

The preferred embodiment node toggling reduction device reduces power consumption by reducing unneeded node toggling that commonly occurs in many types of circuits. The preferred embodiment reduces unneeded node toggling in a circuit by utilizing either a pull-up or pull-down transistor to pull the input of the circuit to a state that minimizes power consumption during certain extended periods in which the circuit is inactive. By tying the circuit input high or low during inactivity, node toggling is reduced or eliminated in that circuit.

Figure 1:
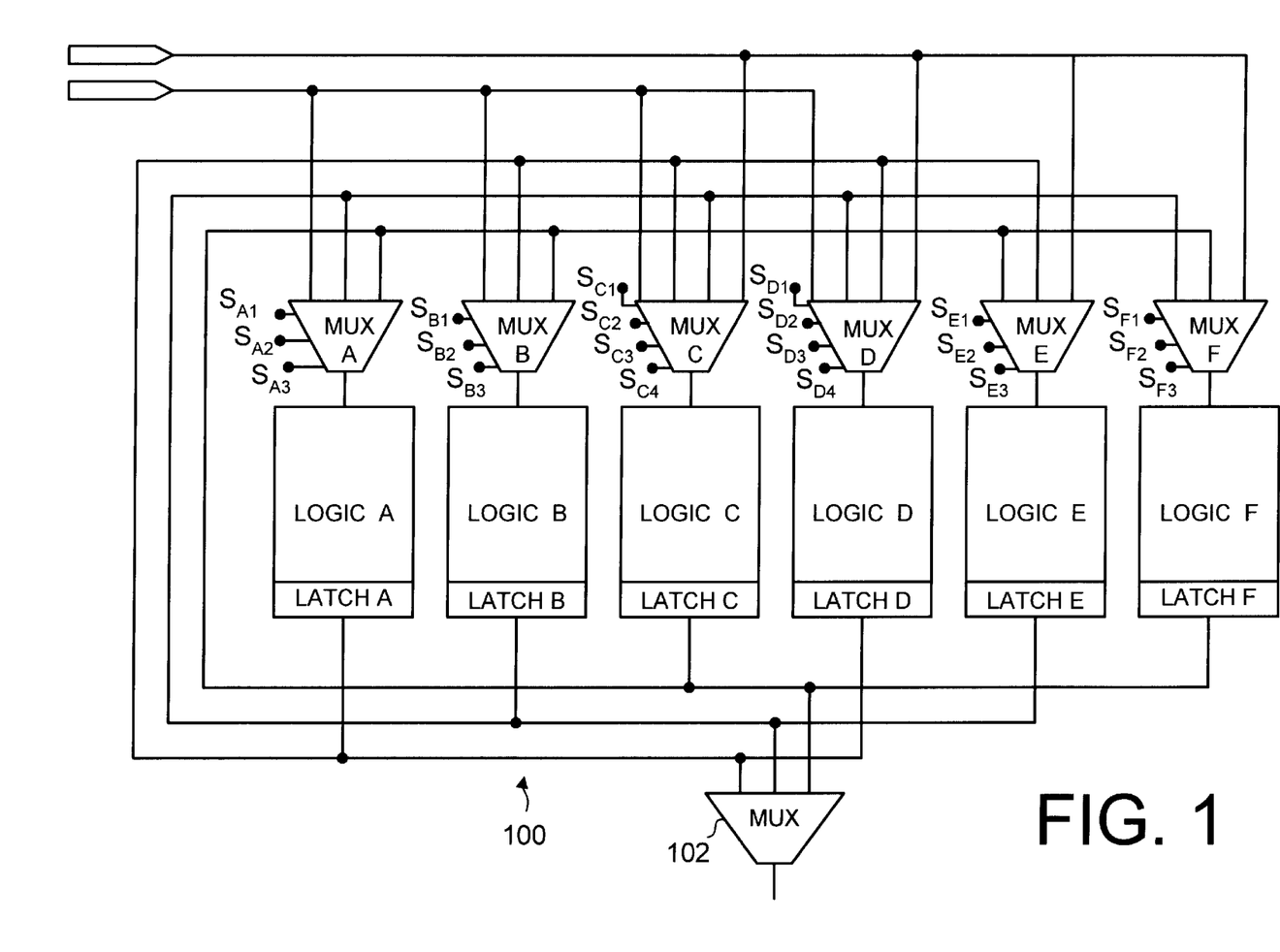
FIG. 1 is a schematic view of a portion of a digital signal processor.

Turning now to FIG. 1, a circuit 100 is illustrated. Circuit 100 is exemplary of the types of circuits in which unnecessary node toggling can occur leading to excessive power consumption. In particular, circuit 100 is a simplified example of a portion of a digital signal processor (DSP) commonly used in mobile applications, such as wireless telephones, which will be used to illustrate the preferred embodiments of the present invention. DSP's are designed to perform many functions, such as data compression and error correction of transmitted signals. Circuit 100 includes 6 sets of logic circuits A–F that perform the basic function of the DSP. The inputs to the logic circuits are selected by corresponding multiplexers A–F using the corresponding decoded selector signals ($S_1$, $S_2$, etc.) of the multiplexer. When a logic circuit is not needed, the decoded selector signals for the corresponding multiplexer can be set to low. The inputs to the logic circuits are multi-line buses that typically comprise 40 separate lines. Thus, by selectively activating $S_{A1}$, $S_{A2}$ and $S_{A3}$ multiplexer A is used to select which of the three input sets of 40 lines are inputted into logic A. Likewise, by selectively activating $S_{C1}$, $S_{C2}$, $S_{C3}$ and $S_{C4}$, multiplexer C is used to select which of the four input sets of 40 lines are inputted into logic C. The output of circuit 100 is determined by output multiplexer 102, which selects which of the three bus lines are to be outputted at any given time.

Logic circuits A–F can include any type of circuit depending upon its specific application. For example, in most DSP devices logic circuits A–F would typically comprise combinatorial logic that, given an input, deterministically computes the output. The combinatorial logic could include any type of logic circuits, such as arithmetic units, multipliers, barrel shifters, bus wide logic functions (such as AND, OR, XOR), comparators, etc. During typical operation, the outputs from only two of the logic circuits A–F are needed at any give time. For this reason and to prevent race conditions, logic circuits A–F include output latches that are used to select and latch the logic circuit outputs as needed. The latches thus determine which logic circuit A–F outputs are fed into the output bus to the output multiplexer 102 and fed back to the multiplexers A–F. In the prior art, the logic circuits A–F whose output is not being used remain active and still receive input signals from their associated multiplexers and output nonrequired data. Thus, the internal nodes of the unused logic circuits continue to toggle in response to the inputs from their respective multiplexer. This unnecessary node toggling results in excessive power consumption.

One solution to this problem is to freeze the multiplexer connected to the unused logic circuits at their last output. This eliminates much of the unnecessary node toggling in the unused logic circuits. Unfortunately, this solution requires a separate feedback loop to latch that last input to the logic circuits. This increases the size of the overall circuit considerably. So, while the four unused logic circuits did not toggle and hence used less power, the active logic circuits used much more power due to their drastically increased complexity. This, is thus, not a complete solution to the problem.

In the preferred embodiment a node toggling reduction device is provided that uses either pull-up or pull-down transistors (collectively referred to as pulling transistors) tied to each input of each logic circuit. Pull-down transistors pull the input line to ground when a high pulling signal is applied to their gate. Pull-down transistors typically comprise N-channel devices with their drain tied to the logic circuit input line and the their source tied to a low voltage (usually ground),. Likewise, pull-up transistors pull the input line to Vdd when a low pulling signal is tied to their gate. Pull-up transistors typically comprise P-channel devices with their drain tied to the logic circuit input line and their source tied to a high voltage (usually Vdd).

Figure 2:
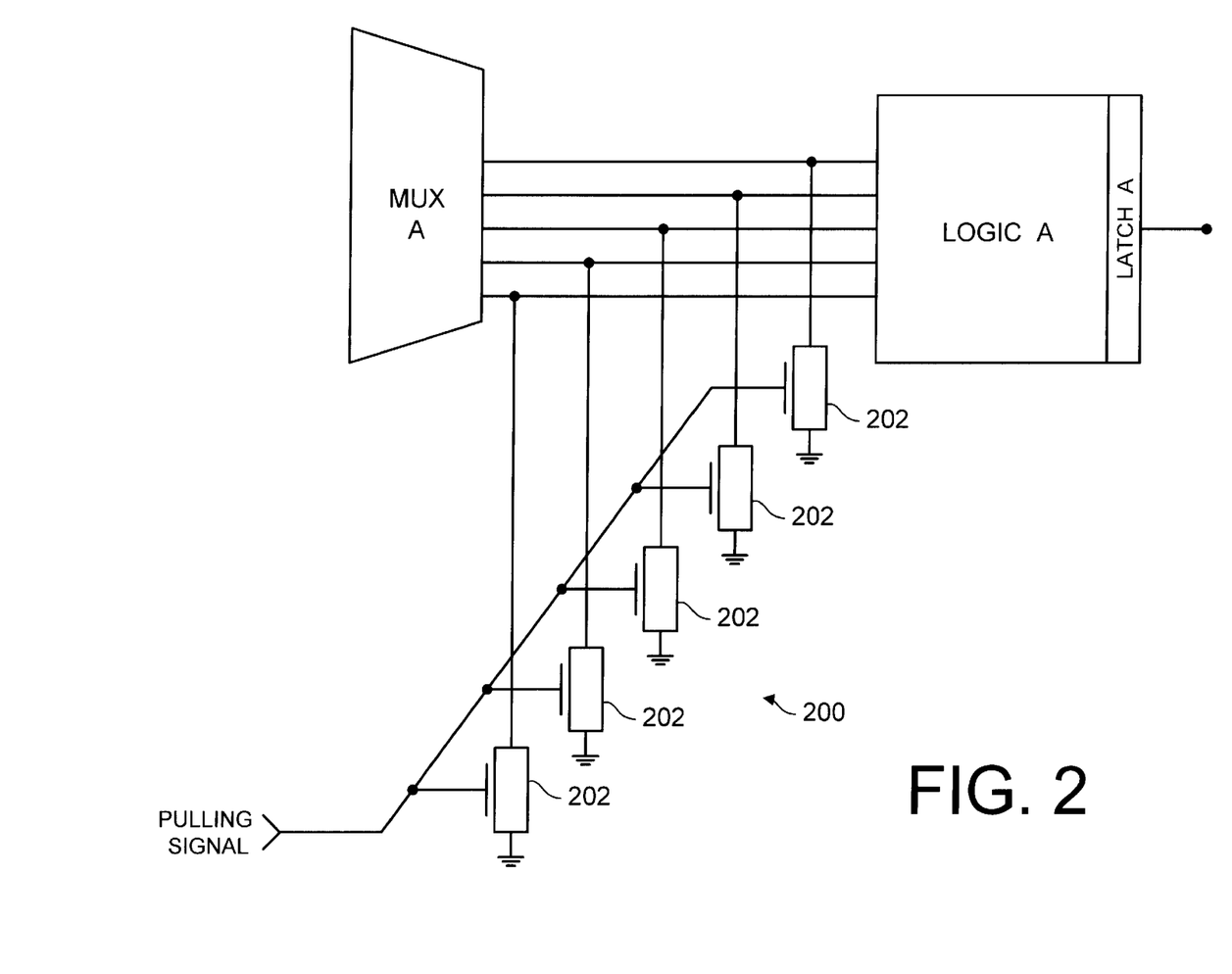
FIG. 2 is a schematic view of a node toggling reduction device in accordance with the preferred embodiment.

Turning now to FIG. 2, a portion of circuit 100 is illustrated with a node toggling reduction device 200 added in accordance with the preferred embodiment. Node toggling reduction device 200 includes a plurality of pulling transistors 202. In the illustrated embodiment, the pulling transistors comprise pull-down transistors with each drain tied to an input of the logic circuit and each source tied to ground. Of course, the pulling transistors could also comprise pull-up transistors. In either case the pulling transistors comprise a means for shunting the device inputs to a preselected voltage and decoupling the logic circuit from receiving transitory input signals from the input lines.

The pulling transistors 202 pull the logic circuit inputs when they are turned on by the appropriate pulling signal. In FIG. 2, only five of the inputs to logic circuit A and five pull-down transistors 202 are illustrated, but as mentioned before, the typical logic circuit would include many more inputs and in the preferred embodiment each of the inputs would be tied to a pulling transistor.

As mentioned above, the pulling transistors can either be pull-up or pull-down transistors. When a pull-down transistor is turned on, the input line is pulled down to the low voltage level and kept there until the transistor is turned off. Likewise, for a pull-up transistor the input is pulled high when the transistor is turned on and is kept high until the transistor is turned off. Thus, with the pulling transistor on, no node toggling occurs, and the input lines are prevented from drifting to undesirable levels which would cause high levels of power dissipation in combinatorial logic circuits A–F. This results in a dramatic reduction in power used by the logic circuits. Of course, some power loss will still occur as a result of leakage current in the transistors of the logic circuits.

Typically, the decision as to whether a pull-up or pull-down transistor is to be used at a particular node will be determined by the number of the various types of transistors and their relative leakage current amounts. In particular, some fabrication technologies result in P-channel transistors that exhibit more leakage current when turned on then their counterpart N-channel transistors do when turned on. In other technologies the opposite is true. If a logic circuit contains approximately the same number of transistors, it will generally be desirable to pull the inputs in such a way that the leakiest types of transistors are turned on, such that the minimum amount of leakage current and its associated power loss occurs. Thus, if P-channel devices are the leakiest, it will generally be preferable to use a pulling transistor which turns the maximum number of P-channel devices on and leaves the maximum number of N-channel devices off.

Of course, if a particular logic circuit input has many more of one type of transistors than it does the other type, it may be more preferable to turn off the most common transistor.

Thus, in the preferred embodiment the logic circuit is analyzed to determine whether power consumption is minimized by pulling particular inputs up or down, and using pull-up and/or pull-down transistors accordingly.

In the preferred embodiment, the timing of the pulling signal, which turns the pulling transistor on to pull the logic circuit input nodes up or down, is designed to minimize power consumption. In particular, when the logic circuit goes inactive such that its output is no longer needed, the preferred embodiment allows the input to float for a set period of time, called a float time in this application, before the pulling transistors are activated. If the inputs are pulled immediately after the logic circuit outputs are not needed, and the logic circuit is needed shortly thereafter and must be turned on again, the resulting power consumption is higher than if the pulling transistors were never turned on. In the preferred embodiment this problem is avoided by tying the maximum float time to the leakage current of the most leaky transistors in the logic circuits and how long it takes this leakage current to take the logic circuits into a region of high conduction and hence high power dissipation.

In the preferred embodiment, the float time is selected proportional to the leakage current of the various transistors in the logic circuit. In particular, the float time is selected to allow the inputs to float as long as possible without having the possibility of normal conduction in the transistors causing DC power loss. This normal conduction DC power loss in CMOS logic circuits occurs when both the N-channel and P-channel transistors in an inverter are turned partially on. When both transistors turn partially on, current flow is quite large and the DC power loss in CMOS is typically much greater then any AC power loss (which occurs with charging and discharging the node). DC power loss occurs when the voltage of previously high or low nodes drift to an intermediate level such that both the N-channel and P-channel transistors are turned partially on. Thus, the preferred embodiment float time is selected to allow the inputs to float as long as possible without having the possibility of leakage current inducing conduction and causing DC power loss.

Figure 3:
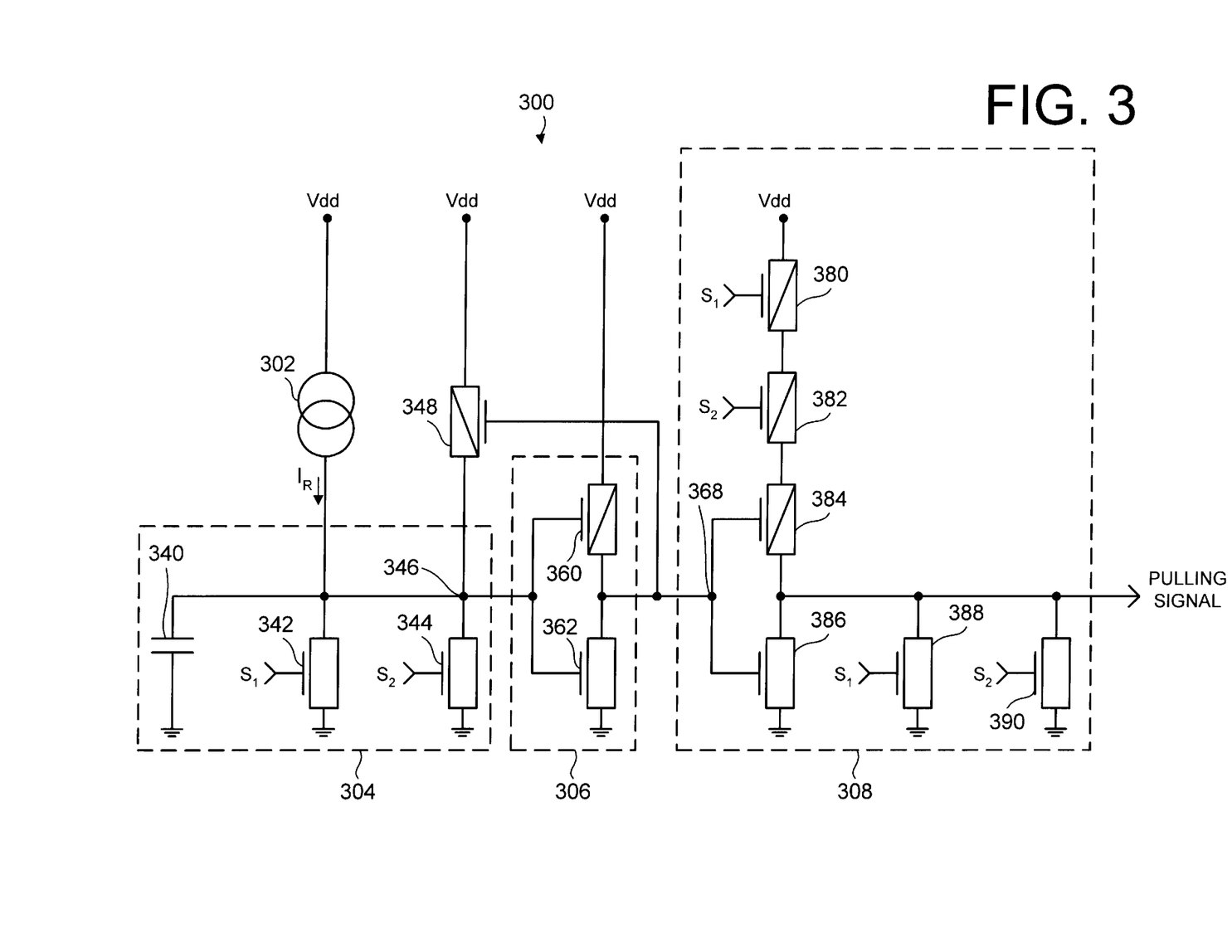
FIG. 3 is a schematic view of timing circuit in accordance with the preferred embodiment.

Turning to FIG. 3 a timing circuit 300 for providing a pulling signal in accordance with the preferred embodiment is illustrated. The timing circuit 300 is designed to provide a pulling signal to the pulling transistors when the corresponding logic circuit has been inactive for a time equal to the float time. Additionally, the timing circuit 300 is designed to quickly turn off the pulling signal when the logic circuit becomes active again. The timing circuit 300 comprises four main parts, a current source 302, an integrator 304, an inverter 306 and a final NOR gate 308. In operation, the integrator 304 integrates the current provided by the current source 302, over time generating a voltage at node 346, the input to the inverter 306. When the voltage at node 346 gets high enough (signifying the end of the float time), it is inverted and transmitted through inverter 306. Transistor 348 insures a rapid transition at the end of the float time. The signal is then inverted a second time by NOR gate 308, resulting in a positive pulling signal which is used to turn on the pulling transistors. It should be understood that this specific example assumes N-channel pulling transistors, and that the complement of this pulling signal would be used to turn on P-channel pulling transistors.

Figure 4:
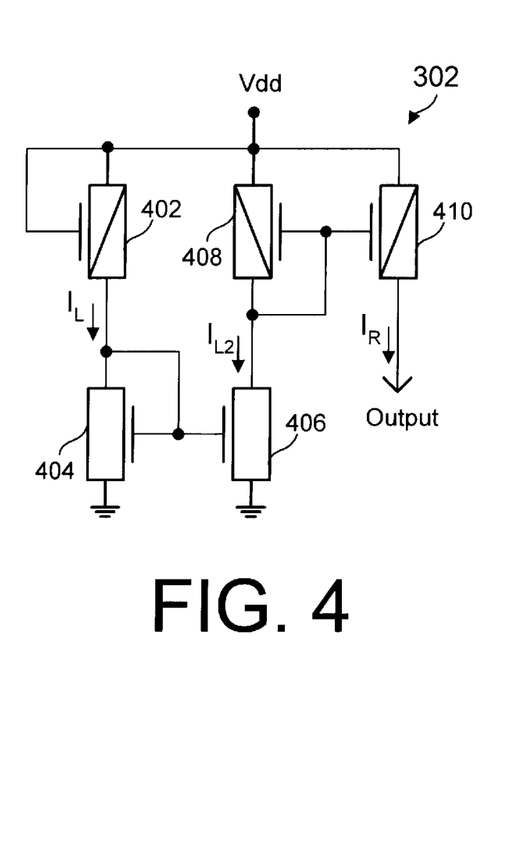
FIG. 4 is a schematic view of a current source in accordance with the preferred embodiment.

Current source 302 is preferably designed to provide a current that is proportional to the leakage current of transistors used in the logic circuits. Turning to FIG. 4, current source 302 is illustrated in more detail. Current source 302 includes a reference transistor 402, a first current mirror comprising transistors 404 and 406, and a second current mirror comprising transistors 408 and 410. Current source 302 is preferably designed to provide a reference current $I_R$ that is 10 to 100 times larger than the leakage current of the leakiest transistor in the logic circuit.

To accomplish this, the reference transistor 402 is preferably selected to have a leakage current that is equal to or greater than the leakiest transistors used in the logic circuit. As such, reference transistor 402 is generally going to be a relatively large transistor of the most leaky type. In most CMOS technologies, the P-channel transistor is the most leaky transistor type. By connecting the source and the gate to Vdd, the reference transistor 402 is turned "off" such that its "off" leakage current $I_L$ flows through transistor 404. The leakage current is multiplied by the first and second current mirrors to provide a reference current $I_R$ that is equal to the leakage current times the current multiplication provided by the current mirrors.

In particular, transistor 406 is preferably selected to be 1–10 times wider then transistor 404 and transistor 410 is preferably selected to be 1–10 times larger than transistor 408. As such, the current $I_{L2}$ flowing through transistors 406 and 408 will be 1–10 times $I_L$, and the current $I_R$ flowing through transistor 410 will be 1–10 times $I_{L2}$. Thus, the preferred embodiment current source provides a reference current $I_R$ that is between 1 and 100 times the leakage current of the leakiest transistor in logic circuit.

Returning to FIG. 3, the reference current $I_R$ is applied to integrator 304. In the preferred embodiment, integrator 304 comprises a capacitor 340 and a transistor for each of the decoded selector signals in the corresponding multiplexer. In the illustrated embodiment, integrator 304 comprises a capacitor 340 and a N-channel transistor 342 with its gate tied to decoded selector signal $S_1$ and N-channel transistor 344 with its gate tied to decoded selector signal $S_2$. When both the decoded selector signals are low (signifying that the corresponding multiplexer is inactive), the transistors 342 and 344 are both turned off. This causes the current from current source 302 to collect as charge on capacitor 340, causing the voltage at node 346 to rise. The voltage at node 346 is proportional to the integral of the current from the current source 302. Whenever either of the decoded selector signals are high (signifying that the corresponding multiplexer is active) the corresponding transistor is turned on, and the voltage at node 346 drains quickly to ground.

The voltage at node 346 is inverted by inverter 306, resulting in the complement voltage appearing at node 368. Inverter 306 is preferably a simple CMOS inverter, comprising a N-channel transistor 362 and a P-channel transistor 360. The voltage at node 368 also serves to control transistor 348. Transistor 348 functions as a driving transistor is added to allow a quick rise in the pulling signal after the float. In particular, when node 368 goes low, driving transistor 348 turns on and drives the voltage at node 346 quickly to Vdd.

The output of inverter 306 is received into NOR gate 308. The output of NOR gate 308 is the pulling signal used to control the pulling transistors. The NOR gate 308 provides further sharpening of the pulling signal and guarantees the immediate turn-off of the pulling signal when the logic circuit becomes active. To accomplish this, NOR gate 308 preferably includes an input for the voltage at node 368 and an input for each of the decoded selector signals of the corresponding multiplexer. Thus, when node 368 or any of the decoded selector signals are high, the pulling signal is low. If node 368 and all of the decoded selector signals are low, then the pulling signal is high and the N-channel pulling transistors shown in FIG. 2 are turned on.

In the illustrated embodiment, NOR gate 308 comprises P-channel transistors 380,382, and 384, and also comprises N-channel transistors 386,388 and 390. The gates of transistors 380 and 388 are tied to decoded selector signal $S_1$, and the gates of transistors 382 and 390 are tied to decoded selector signal $S_2$. Thus, if decoded selector signal $S_1$ goes high, transistor 380 turns off and transistor 388 turns on, driving the pulling signal low. Likewise, if decoded selector signal $S_2$ goes high, transistor 382 turns off and transistor 390 turns on, once again driving the pulling signal low. Thus, when the logic circuit goes from inactive to active, the decoded selector signal will instantly take the pulling signal low. This allows the logic circuit to become operational very quickly.

Figure 5:
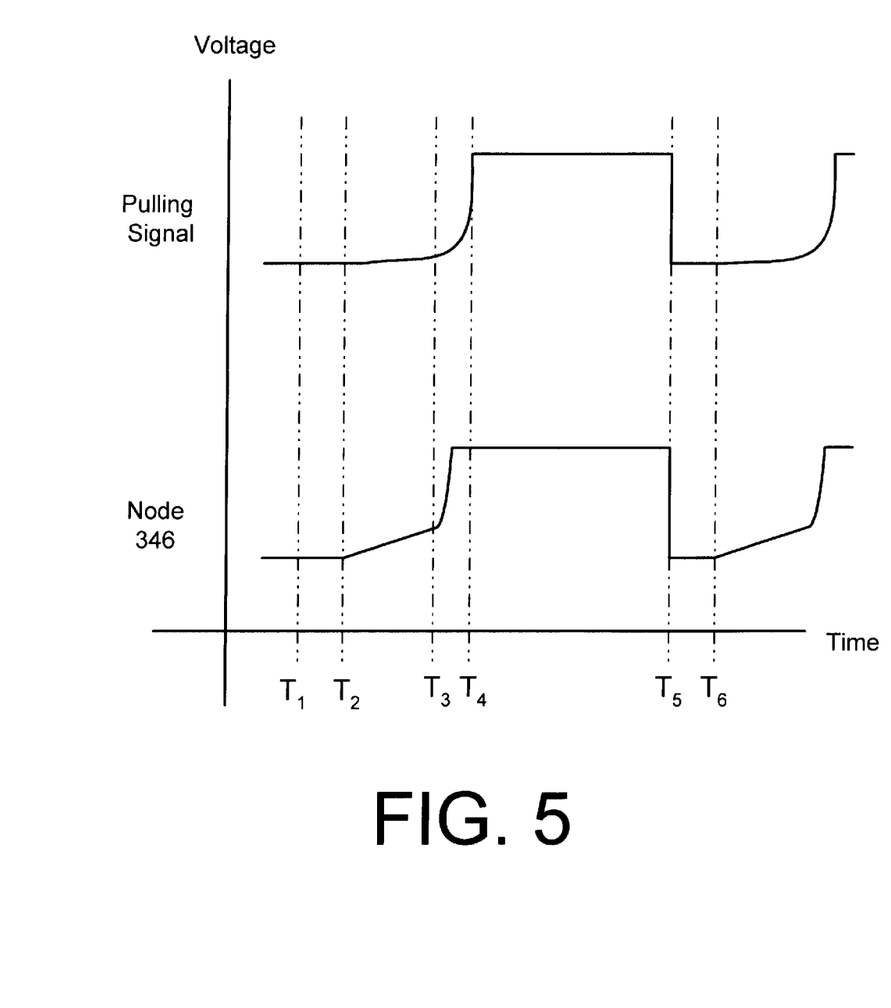
FIG. 5 is a timing diagram in accordance with the preferred embodiment.

Turning to FIG. 5, a voltage waveform is shown illustrating the voltage at node 346 and at the pulling signal output as a function of time. At time $T_1$ the multiplexer has recently been active, causing transistors 342 or 344 to be turned on and the voltage at node 346 to stay low. At time $T_2$, the multiplexer goes inactive. This turns off the transistors in the integrator, and the voltage at node 346 begins to rise, and the voltage at node 368 (the output of the inverter) begins to fall. The voltage at node 346 rises as the integral of the current from current source 302. At time $T_3$ the voltage at node 346 rises enough to cause the voltage at node 368 to drop below the threshold voltage of transistor 348, the transistor 348 turns on and the voltage at node 346 quickly rises to Vdd. This signal propagates through the inverter 306 and the NOR gate 308 as shown, resulting in a pulling signal that closely follows the voltage at node 346. At time $T_4$, the pulling signal has gone high thus turning on the pulling transistors, which pull the input lines of the logic circuit to either high or low. The time period between when the logic circuit first goes inactive ($T_2$) and when the pulling signal goes active ($T_4$) is the float time—the time the inputs to an inactive logic circuit are allowed to float.

When the corresponding logic circuit goes again active, one of the decoded selector signals $S_1$ or $S_2$ will go high. This immediately takes the NOR gate 308 and the inverter 306 low. Thus, at time $T_5$, both node 346 and the pulling signal immediately go low (without having to wait for the signal to propagate through the integrator 304 and the inverter 306. These signals both stay low until time $T_6$, when the logic circuit again goes inactive and the current source 302 again begins to charge integrator 304.

Thus, the preferred embodiment provides a timing signal based on the inactivity of the corresponding logic circuits and the leakage current of transistors in that logic circuit. It should be noted however, that some statistical analysis of logic circuit usage may provide additional information as how to minimize power consumption. In those cases, the preferred embodiment disclosed above may be modified to reflect the statistical analysis. In other cases, a different timing mechanism may be preferable.

Figure 6:
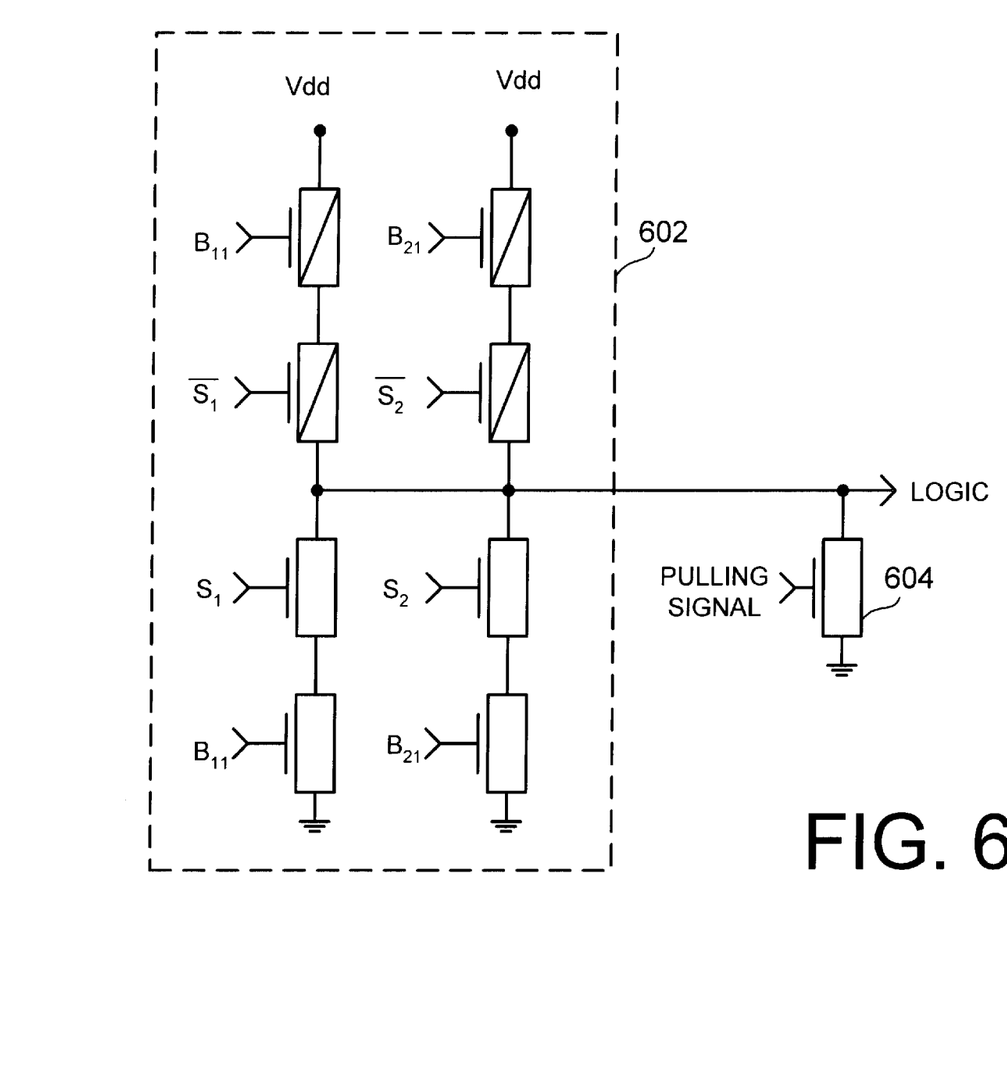
FIG. 6 is a schematic view of multiplexer portion and a pulling transistor in accordance with the preferred embodiment.

The preferred embodiment of the present invention can be used with little modification for a wide range of logic circuits and many types of multiplexer circuits. Turning to FIG. 6, a portion of a suitable multiplexer 602 is shown with a corresponding pulling transistor 604. Multiplexer portion 602 works well with the preferred embodiment and has the additional advantage of being more simple than most other multiplexers. FIG. 6 only illustrates a portion of a typical multiplexer. In particular, FIG. 6 shows only the transistors needed to switch between two individual input lines. An actual multiplexer will have many sets of input lines that are switched together. As an example, a multiplexer used in circuit 100 (FIG. 1) needs to be able to switch between sets of 40 input lines and to provide a 40 output lines. Additionally, a multiplexer may have the ability to switch between more than two sets of inputs. For example, multiplexer C of circuit 100 receives four sets of 40 input lines and selects one of those four sets for output.

The output of multiplexer portion 602 comprises the signal from either input line $B_{11}$ or $B_{21}$, depending on the state of the decoded selector lines $S_1$, $S_2$ and their complements. In particular, when $S_1$ is high, the complement of $B_{11}$ is delivered to the output. When $S_2$ is high, the complement of $B_{21}$ is delivered to the output.

The multiplexer portion 602 shown in FIG. 6 has the advantage of avoiding the transistor complexity of multiplexers fabricated from standard logic gates.

Figure 7:
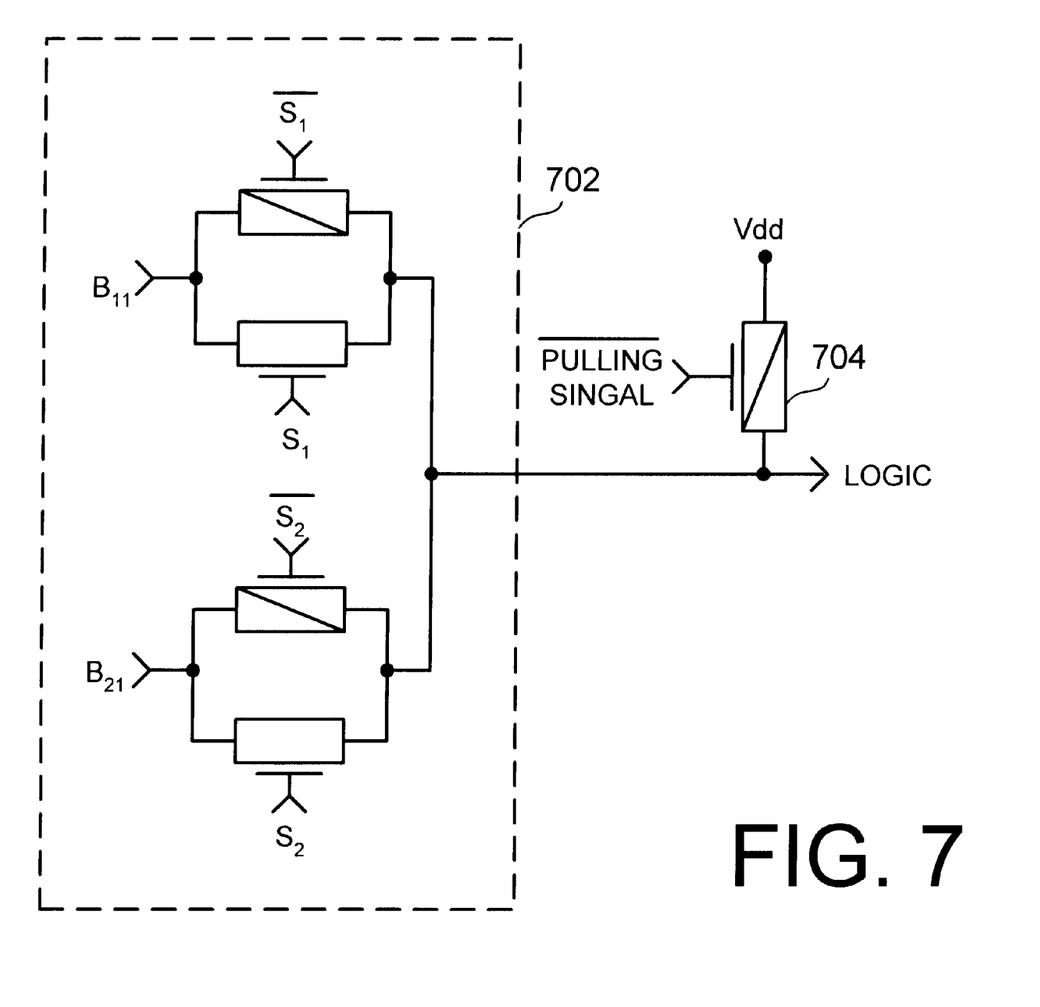
FIG. 7 is a schematic view of a multiplexer portion and a pulling transistor in accordance with the preferred embodiment.

Turning to FIG. 7, a second multiplexer portion 702 is illustrated with a corresponding pulling transistor 704. In this embodiment, the pulling transistor 704 comprises a pull-up transistor designed to pull the corresponding input node to Vdd. Again, FIG. 7 only illustrates a portion of the multiplexer 702, and an actual multiplexer would have the ability to switch many more sets of lines. Multiplexer portion 702 shown in FIG. 7 has the advantage of avoiding the transistor complexity of multiplexers fabricated from standard logic gates.

The output of multiplexer portion 702 comprises the signal from either the input line $B_{11}$ or $B_{21}$, depending on the state of the decoded selector lines $S_1$, $S_2$ an their complements. In particular, when $S_1$ is high, $B_{11}$ is delivered to the output. When $S_2$ is high, $B_{21}$ is delivered to the output.

Figure 8:
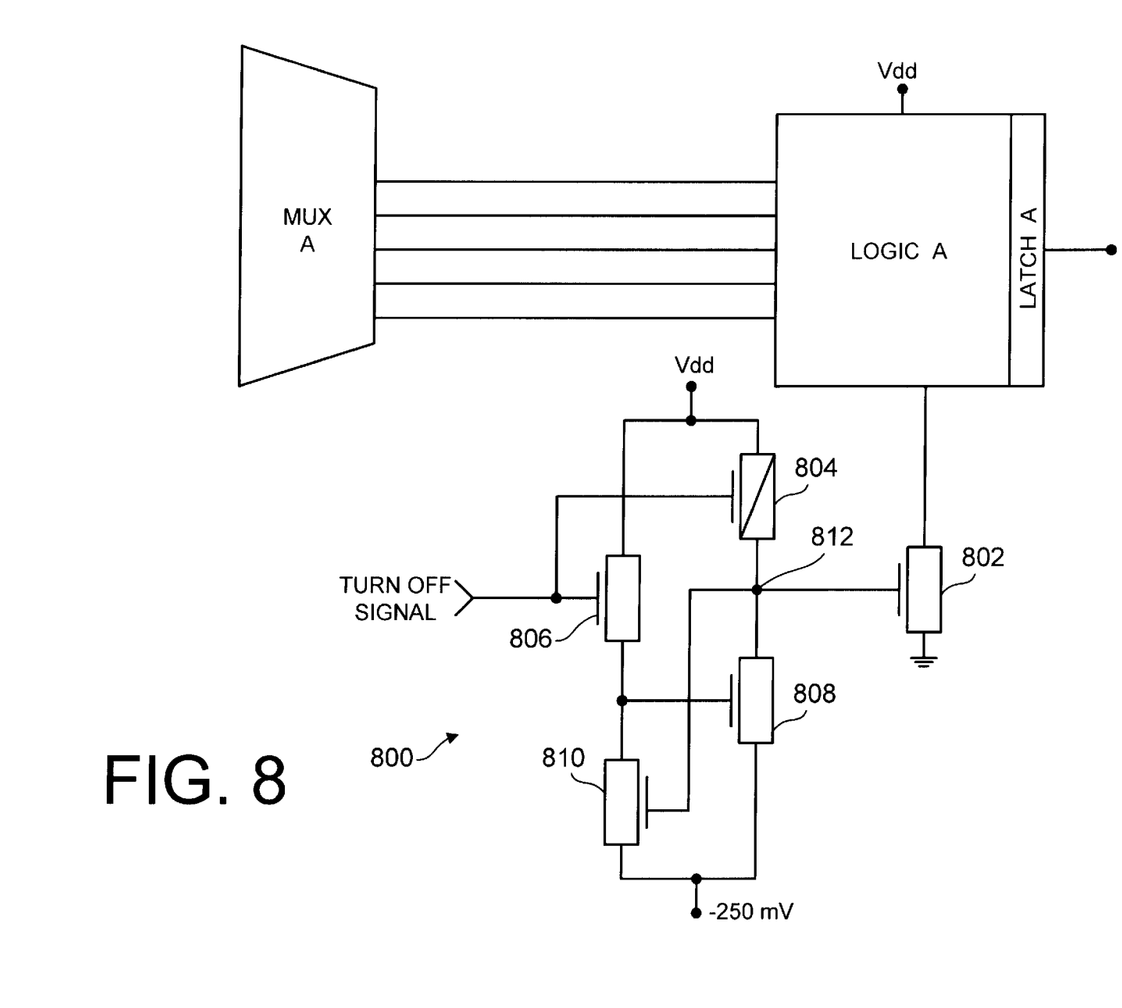
FIG. 8 is a schematic power turn off device in accordance with another preferred embodiment.

Another embodiment of the present invention uses a second timing circuit with a longer delay to shut off power to the logic circuit when it is indicated that the logic circuit will be inactive for a long period of time. Turning now to FIG. 8, a logic circuit turn-off device 800 is illustrated. The turn-off device 800 further reduces power consumption in the logic circuit by disconnecting the logic circuit from its power supply during relatively long periods of inactivity. This is preferably done using a power supply disconnecting transistor which is connected between the logic circuit and one of its power supply nodes, typically either Vdd or ground. In the illustrated embodiment, the power supply disconnecting transistor 802 comprises an N-channel device that disconnects the logic circuit from its ground when turned off. The power supply disconnecting transistor 802 preferably has lower "gate" or "input" voltage than ground to ensure that transistor 802 is turned strongly off. Furthermore, transistor 802 is preferably a large transistor with a low threshold to ensure high conductivity when turned on.

The preferred logic turn-off device 800 comprises P-channel transistor 804 and N-channel transistors 806, 808 and 810. When the turn-off signal is low, transistor 806 turns off and transistor 804 turns on. This pulls node 812 high, turning on the power supply disconnecting transistor 802 such that power is supplied to the logic circuit. When the turn-off signal goes high, transistor 806 turns on and transistor 804 turns off. This turns on transistor 808, which causes node 812 to be pulled down to within a few millivolts of −250 mV. This turns off the power supply disconnecting transistor 802 such that power consumption of the logic circuit is minimized.

As stated above, in the preferred embodiment turn-off device 800 is tied to minus 250 mV. By using a voltage lower than ground, it is assured that the power-supply disconnecting transistor 802 is completely turned off with no current flowing when the turn on signal is high This minimizes power consumption more than if the input voltage to the power-supply disconnecting transistor 802 was only equal to ground.

In an alternative embodiment, the power-supply disconnecting transistor can comprise a P-channel transistor inserted between Vdd and the logic circuit. This embodiment is generally not preferred because of increased transconductance.

In the preferred embodiment, a timing circuit similar to timing circuit 300 is used to provide the turn-off signal that controls when the logic circuit is disconnected from its power supply. In the preferred embodiment however, the timing circuit is modified to provide the turn-off signal after a much greater period of inactivity, preferably 10 times greater.

While the invention has been particularly shown and described with reference to a preferred exemplary embodiment thereof, it will be understood by those skilled in the art that various changes in form and details may be made therein without departing from the spirit and scope of the invention. It will be also understood that, while various of the conductors are shown in the drawing as single lines, they are not so shown in a limiting sense, and may comprise plural conductors, as is understood in the art.

What is claimed is:

1. An apparatus comprising:
   a plurality of devices having device inputs, the plurality of devices consuming dynamic power when receiving transitory input signals during a first period and outputting nonrequired data in response to the transitory input signals during a second period; and
   shunting means for shunting the device inputs to at least one preselected voltage level for at least a portion of the second period;

decoupling means for selectively decoupling the transitory input signals from the device inputs at sometime after the beginning of the second period.

2. The apparatus of claim 1 further comprising timing means coupled to the shunting means for activating the shunting means sometime after the beginning of the second period.

3. The apparatus of claim 1 wherein said shunting means comprises at least one pulling transistor, said at least one pulling transistor coupled to said plurality of device inputs and to said at least one voltage potential such that said at least one pulling transistor pulls said plurality of devices input to said at least one voltage potential when a pulling signal is received.

4. The apparatus of claim 1 wherein said apparatus further comprises a timing circuit, said timing circuit generating a pulling signal after said plurality of devices have been outputting non-required data for a time period, and wherein said shunting means comprises at least one pulling transistor, said at least one pulling transistor coupled to said plurality of device inputs and to said at least one voltage potential such that said at least one pulling transistor pulls said plurality of devices input to said at least one voltage potential when said pulling signal is received.

5. The apparatus of claim 4 wherein said timing circuit includes a current source, said current source providing a reference current proportional to said leakage current of a transistor in the plurality of devices.

6. An apparatus to reduce power consumption in a logic circuit having an input, the apparatus comprising:
   a) a timing circuit, said timing circuit generating a pulling signal after said logic circuit has been inactive for a time period, wherein said time period is proportional to a leakage current of a transistor in said logic circuit;
   b) a pulling transistor, said pulling transistor coupled to said logic circuit input and a first voltage potential such that said pulling transistor pulls said logic circuit input to said first voltage potential when said pulling signal is received.

7. The apparatus of claim 6 wherein said pulling transistor comprises a pull-up transistor.

8. The apparatus of claim 6 wherein said pulling transistor comprises a pull-down transistor.

9. The apparatus of claim 6 wherein said timing circuit includes a current source, said current source providing a reference current proportional to said leakage current of said transistor in said logic circuit.

10. The apparatus of claim 9 wherein said timing circuit includes an integrator, said integrator receiving said reference current and providing a reference voltage proportional to an amount of said current received over time.

11. The apparatus of claim 10 wherein said timing circuit includes a NOR gate, said NOR gate coupled to said reference voltage and providing said pulling signal when said reference voltage reaches a first level.

12. The apparatus of claim 11 wherein said NOR gate is coupled to selector inputs for said logic circuit such that said NOR gate turns off said pulling signal when any of said selector inputs are active.

13. The apparatus of claim 12 wherein said NOR gate is coupled to said reference voltage through an inverter, said inverter providing an inverted reference voltage to an input of said NOR gate.

14. The apparatus of claim 13 wherein said timing circuit further comprises a transistor coupled to an output of said inverter and to an input of said inverter such that said transistor drives said reference voltage high when said inverted reference voltage reaches a predetermined low value.

15. The apparatus of claim 6 wherein said timing circuit includes:
   i) a current source providing a reference current proportional to a leakage current in a representative transistor in said logic circuit;
   ii) an integrator, said integrator receiving said reference current and providing a reference voltage proportional to an amount of said reference current received over time;
   iii) a NOR gate coupled to said reference voltage, said NOR gate further receiving selector inputs for said logic circuit such that said NOR gate turns off said pulling signal when any of said selector inputs are active.

16. The apparatus of claim 15 wherein said NOR gate is coupled to said reference voltage through an inverter, said inverter providing an inverted reference voltage to an input of said NOR gate, and wherein said timing circuit further comprises a transistor coupled to an output of said inverter and to an input of said inverter such that said transistor drives said reference voltage high when said inverted reference voltage reaches a predetermined low value.

17. The apparatus of claim 15 wherein said current source includes a reference transistor having a leakage current representative of transistors in said logic circuit and a current mirror, said current mirror magnifying said leakage current to provide said reference current.

18. The apparatus of claim 17 wherein said reference transistor is selected to have a leakage current equal or greater than any other transistor in said logic circuit.

19. The apparatus of claim 17 wherein said current mirror magnifies said reference current by between 1 and 100.

20. The apparatus of claim 6 wherein a multiplexer is provided to select one of a plurality of inputs to be inputted into said logic circuit.

21. The apparatus of claim 20 wherein said multiplexer comprises:
   i) a first P-channel transistor having a gate, a source and a drain and a second P-channel transistor having a gate, a source and a drain, said first P-channel transistor and said second P-channel transistor connected in series, the gate of said first P-channel transistor connected to a first one of said plurality of inputs, the gate of said second P-channel transistor connected to a first selector signal complement;
   ii) a first N-channel transistor having a gate, a source and a drain and a second N-channel transistor having a gate, a source and a drain, said first N-channel transistor and said second N-channel transistor connected in series, the gate of said first N-channel transistor connected to a first selector signal and the gate of said second N-channel transistor connected to said first one of said plurality of inputs;
   iii) a third P-channel transistor having a gate, a source and a drain and a fourth P-channel transistor having a gate, a source and a drain, said third P-channel transistor and said fourth P-channel transistor connected in series, the gate of said third P-channel transistor connected to a second one of said plurality of inputs, the gate of said fourth P-channel transistor connected to a second selector signal complement;
   iv) a third N-channel transistor having a gate, a source and a drain and a fourth N-channel transistor having a gate, a source and a drain, said third N-channel transistor and said fourth N-channel transistor connected in series, the gate of said third N-channel transistor connected to a second selector signal and the gate of said fourth N-channel transistor connected to said second one of said plurality of inputs.

22. The apparatus of claim 20 wherein said multiplexer comprises:
   i) a first P-channel transistor having a gate, a source and a drain and a first N-channel transistor having a gate, a source and a drain, said first P-channel transistor and said first N-channel transistor connected in parallel, the gate of said first P-channel transistor connected to a first selector signal complement and the gate of said first N-channel transistor connected to a first selector signal, the source of said first P-channel transistor and the drain of said first N-channel transistor connected to a first one of said plurality of inputs, the drain of said first P-channel transistor and the source of said first N-channel transistor connected to a first input of the logic circuit; and
   ii) a second P-channel transistor having a gate, a source and a drain and a second N-channel transistor having a gate, a source and a drain, said second P-channel transistor and said second N-channel transistor connected in parallel, the gate of said second P-channel transistor connected to a second selector signal complement and the gate of said second N-channel transistor connected to a second selector signal, the source of said second P-channel transistor and the drain of said second N-channel transistor connected to a second one of said plurality of inputs, the drain of said first P-channel transistor and the source of said first N-channel transistor connected to said first input of the logic circuit.

23. An apparatus for reducing power consumption in a logic circuit, the apparatus comprising:
   a) a timing circuit, said timing circuit comprising;
      i) a current source, said current source providing a reference current proportional to a leakage current of a transistor in the logic circuit;
      ii) an integrator, said integrator receiving said reference current and providing a reference voltage proportional to amount of said reference current received over time;
      iii) an inverter, said inverter receiving said reference voltage and providing an inverted reference voltage;
      iv) a NOR gate, said NOR gate receiving said inverted reference voltage and a plurality of select signals, said NOR gate providing a pulling signal when said inverted reference signal and said plurality of select signals are low; and
   b) a pulling transistor, said pulling transistor coupled to said logic circuit input and a first voltage potential such that said pulling transistor pulls said logic circuit input to said voltage potential when said pulling signal is received.

24. The apparatus of claim 23 wherein pulling transistor comprises an N-channel transistor and wherein said first voltage potential is substantially ground.

25. The apparatus of claim 23 wherein pulling transistor comprises an P-channel transistor and wherein said first voltage potential is substantially Vdd.

26. The apparatus of claim 23 wherein said timing circuit further comprises a driving transistor, said driving transistor coupled to an output of the inverter and to an input of the inventor such that said driving transistor drives said reference voltage high when said inverted reference voltage reaches a predetermined low value.

27. The apparatus of claim 23 wherein said current source includes a reference transistor, wherein said reference transistor is selected to have a leakage current equal or greater than any other transistor in said logic circuit, and further comprising a current mirror, said current mirror magnifying said leakage current by between 1 and 100 to provide said reference current.

28. The apparatus of claim 23 wherein a multiplexer is provided to select one of a plurality of inputs to be inputted into said logic circuit.

29. The apparatus of claim 28 wherein said multiplexer comprises:
   i) a first P-channel transistor having a gate, a source and a drain and a second P-channel transistor having a gate, a source and a drain, said first P-channel transistor and said second P-channel transistor connected in series, the gate of said first P-channel transistor connected to a first one of said plurality of inputs, the gate of said second P-channel transistor connected to a first selector signal complement;
   ii) a first N-channel transistor having a gate, a source and a drain and a second N-channel transistor having a gate, a source and a drain, said first N-channel transistor and said second N-channel transistor connected in series, the gate of said first N-channel transistor connected to a first selector signal and the gate of said second N-channel transistor connected to said first one of said plurality of inputs;
   iii) a third P-channel transistor having a gate, a source and a drain and a fourth P-channel transistor having a gate, a source and a drain, said third P-channel transistor and said fourth P-channel transistor connected in series, the gate of said third P-channel transistor connected to a second one of said plurality of inputs, the gate of said fourth P-channel transistor connected to a second selector signal complement;
   iv) a third N-channel transistor having a gate, a source and a drain and a fourth N-channel transistor having a gate, a source and a drain, said third N-channel transistor and said fourth N-channel transistor connected in series, the gate of said third N-channel transistor connected to a second selector signal and the gate of said fourth N-channel transistor connected to said second one of said plurality of inputs.

30. The apparatus of claim 28 wherein said multiplexer comprises:
   i) a first P-channel transistor having a gate, a source and a drain and a first N-channel transistor having a gate, a source and a drain, said first P-channel transistor and said first N-channel transistor connected in parallel, the gate of said first P-channel transistor connected to a first selector signal complement and the gate of said first N-channel transistor connected to a first selector signal, the source of said first P-channel transistor and the drain of said first N-channel transistor connected to a first one of said plurality of inputs, the drain of said first P-channel transistor and the source of said first N-channel transistor connected to a first input of the logic circuit; and
   ii) a second P-channel transistor having a gate, a source and a drain and a second N-channel transistor having a gate, a source and a drain, said second P-channel transistor and said second N-channel transistor connected in parallel, the gate of said second P-channel transistor connected to a second selector signal complement and the gate of said second N-channel transistor connected to a second selector signal, the source of said second P-channel transistor and the drain of said second N-channel transistor connected to a second one of said plurality of inputs, the drain of said first P-channel transistor and the source of said first N-channel transistor connected to said first input of the logic circuit.

31. A method for reducing power consumption in a logic circuit having an input, the method comprising the steps of:
   a) providing a pulling signal after said logic circuit has been inactive for a first period of time, said first period of time determined by a leakage current representative of a transistor in said logic circuit; and
   B) pulling the input of the logic circuit to a first potential when said pulling signal is active.

32. The method of claim 31 wherein the step of pulling the input of the logic circuit to a first potential comprises pulling the input to a positive supply voltage Vdd of the logic circuit.

33. The method of claim 31 wherein the step of pulling the input of the logic circuit to a first potential comprises pulling the input to ground.

34. The method of claim 31 wherein the leakage current equal to or greater than the leakage current of any transistor in the logic circuit.

35. The method of claim 31 wherein the step of providing a pulling signal comprises integrating a reference current proportional to the leakage current over time.

36. The method of claim 35 wherein said reference current is 1 to 100 times larger than said leakage current.

37. The method of claim 35 wherein the step of providing a pulling signal comprises driving said pulling signal active when the integrated reference current reaches a predetermined value.

38. The method of claim 31 further comprising the step of deactivating said pulling signal when said logic circuit goes active again.

39. An apparatus to reduce power consumption in a logic circuit having a power supply, the apparatus comprising:
   a) a timing circuit, said timing circuit generating a power-off signal after said logic circuit has been inactive for a first time period;
   b) a power-supply disconnect transistor, said power-supply disconnect transistor coupled to the logic circuit power supply such that said power-supply disconnect transistor disconnects said logic circuit from said power supply when said power-off signal is received.

40. The apparatus of claim 39 wherein said first time period is proportional to a leakage current of a transistor in said logic circuit.

41. The apparatus of claim 40 wherein said timing circuit includes a current source, said current source providing a reference current proportional to said leakage current of said transistor in said logic circuit.

42. The apparatus of claim 41 wherein said timing circuit includes an integrator, said integrator receiving said reference current and providing a reference voltage proportional to an amount of said current received over time.

43. The apparatus of claim 42 wherein said timing circuit includes a NOR gate, said NOR gate, said NOR gate coupled to said reference voltage and providing said pulling signal when said reference voltage reaches a first level.

44. The apparatus of claim 43 wherein said NOR gate is coupled to selector inputs for said logic circuit such that said NOR gate turns of said pulling signal when any of said selector inputs are active.

45. The apparatus of claim 44 wherein said NOR gate is coupled to said reference voltage through an inverter, said inverter providing an inverted reference voltage to an input of said NOR gate.

46. The apparatus of claim 45 wherein said timing circuit further comprises a transistor coupled to an output of said inverter and to an input of said inverter such that said transistor drives said reference voltage high when said inverted reference voltage reaches a predetermined low value.

47. The apparatus of claim 39 wherein said timing circuit includes:
   i) a current source providing a reference current proportional to a leakage current in a representative transistor in said logic circuit;
   ii) an integrator, said integrator receiving said reference current and providing a reference voltage proportional to an amount of said reference current received over time;
   iii) a NOR gate coupled to said reference voltage, said NOR gate further receiving selector inputs for said logic circuit such that said NOR gate turns off said pulling signal when any of said selector inputs are active; and
   iv) an inverter, wherein said NOR gate is coupled to said reference voltage through said inverter, said inventor providing an inverted reference voltage to an input of said NOR gate, and wherein said timing circuit further comprises a driving transistor coupled to an output of said inverter and to an input of said inverter such that said driving transistor drives said reference voltage high when said inverted reference voltage reaches a predetermined low.

* * * * *